United States Patent
Meißner

(10) Patent No.: US 12,392,830 B2
(45) Date of Patent: Aug. 19, 2025

(54) BATTERY TEST STAND AND METHOD

(71) Applicant: HAHN Automation GmbH, Rheinböllen (DE)

(72) Inventor: Thomas Meißner, Pfalzfeld (DE)

(73) Assignee: HAHN AUTOMATION GMBH, Rheinbollen (DE)

( * ) Notice: Subject to any disclaimer, the term of this patent is extended or adjusted under 35 U.S.C. 154(b) by 71 days.

(21) Appl. No.: 18/326,626

(22) Filed: May 31, 2023

(65) Prior Publication Data

US 2023/0384381 A1 Nov. 30, 2023

(51) Int. Cl.
*G01R 31/36* (2020.01)
*G01R 31/3842* (2019.01)
*H02J 7/00* (2006.01)

(52) U.S. Cl.
CPC ..... *G01R 31/3644* (2013.01); *G01R 31/3842* (2019.01); *H02J 7/0042* (2013.01)

(58) Field of Classification Search
None
See application file for complete search history.

(56) References Cited

U.S. PATENT DOCUMENTS

| 2013/0187661 A1* | 7/2013 | Henkel | G01R 31/69 |
| | | | 324/503 |
| 2016/0109530 A1 | 4/2016 | Gorbold et al. | |
| 2021/0278481 A1* | 9/2021 | Lubeley | G01R 27/205 |
| 2021/0313752 A1* | 10/2021 | Ho | H01M 10/4285 |

FOREIGN PATENT DOCUMENTS

| DE | 102018117815 A1 | 1/2020 |
| DE | 102019211384 A1 | 2/2021 |

* cited by examiner

*Primary Examiner* — Jas A Sanghera
(74) *Attorney, Agent, or Firm* — CANTOR COLBURN LLP

(57) ABSTRACT

A battery test stand having a source for providing electrical charging power to a battery to be tested, includes a first connection for connecting a battery first terminal to a source first terminal, and a second connection for connecting a battery second terminal to a source second terminal. The first connection has a first connector with at least two contact pins. In the mated state, a respective contact pin is seated in each case in an associated contact socket of the first connector and each contact pin forms in each case an electrical contact with each contact socket. The second connection includes a second connector with two contact pins. In the mated state, a respective contact pin is seated in an associated contact socket of the second connector and each contact pin forms an electrical contact with each contact socket, having a monitoring device for monitoring all electrical contacts.

10 Claims, 3 Drawing Sheets

BATTERY TEST STAND AND METHOD

CROSS-REFERENCE TO RELATED APPLICATIONS

This application claims the benefit of German patent application no. 10 2022 113 771.6, filed on 31 May 2022, the disclosure of which is incorporated herein by reference in its entirety.

TECHNICAL HELD

The present disclosure relates to a battery test stand, a connector for a battery test stand, and a method.

BACKGROUND

Modern motor vehicles are increasingly equipped with completely electric motor drive or hybrid drive. A battery, which is also designated as a traction battery, is used here to supply one electric motor or multiple electric motors with electrical power in order to drive the relevant vehicle by means of the electric motor or by means of multiple electric motors.

During the production of such batteries, they are subjected to a variety of tests. Among other things, a power test of the battery takes place, which ensures the functionality and functional reliability within the scope of an end-of-line test. A relevant battery to be tested is charged and discharged multiple times in a short time here. Furthermore, the battery can be subjected to a high-voltage of up to 10 kilovolts for insulation testing.

In the context of these tests, it is crucial that reliable pug connections are made for the transmission of electrical power in order to connect the battery to be tested to the test devices. It is known, for example, to provide a connector with a single pin and a single contact socket for each terminal of a battery, with the contact between pin and contact socket being monitored, for example, by means of thermocouples or other sensors. However, such thermocouples are prone to failure and are costly to operate. In addition, thermal sensors are not approved for high-voltage tests with voltages of up to 10 kilovolts, so that alternative types of contact monitoring must be used for such high-voltage tests if contact monitoring is to be provided.

SUMMARY

Against this background, the present disclosure is based on the technical problem of specifying a battery test stand which enables reliable monitoring of a contacting of plug connections. Furthermore, a connector and a method are to be specified.

According to a first aspect, the disclosure relates to a battery test stand, comprising a source for providing an electrical charging power for a battery to be tested, a first connection for connecting a first terminal of the battery to a first terminal of the source, a second connection for connecting a second terminal of the battery to a second terminal of the source, wherein the first connection comprises a first connector, wherein the first connector comprises at least two contact pins, wherein, in the mated state, a respective contact pin is seated in a respective associated contact socket of the first connector and each contact pin forms in each case an electrical contact with each contact socket, wherein the second connection comprises a second connector, wherein the second connector comprises at least two contact pins, wherein, in the mated state, a respective contact pin is seated in each case in an associated contact socket of the second connector and each contact pin forms in each case an electrical contact with each contact socket, having a monitoring device for monitoring all electrical contacts.

Instead of providing a connector for each connection with a single contact pin of sufficiently large dimensions for power transmission and a single contact socket assigned to the contact pin and of sufficiently large dimensions, the current path in the region of the connector is artificially divided according to the disclosure and routed via two or more contacts for each connection in order to monitor these contacts in a targeted manner. Therefore, an actually excessive number of contact pins and contact sockets for each connector is deliberately accepted in order to simplify monitoring of the plug connection in question and thus increase the safety of the battery test stand.

The monitoring of all electrical contacts enables early detection of contact problems before they lead to production downtime, damage or fire. In particular, insidiously progressing contact problems can be detected and eliminated at an early stage. A success of a maintenance is immediately measurable after an exchange of the defective components, because the monitoring of all electrical contacts takes place.

When a source is referred to here, it can be a source that can also be operated as a sink for discharging a battery to be tested.

According to one embodiment of the battery test stand, it is provided that the monitoring device is designed to compare the respective individual currents flowing via the individual electrical contacts, with each electrical contact being assigned a device for current measurement.

It may be provided that the monitoring device is designed to compare the respective contact resistances formed at the individual electrical contacts, wherein a device for current measurement is assigned to each electrical contact and wherein a device for voltage measurement is assigned to each connector.

In particular, the individual currents of all contacts of a respective connector can therefore be monitored.

In the mated activated state, the symmetry of the current distribution of all contacts of a respective connector and optionally for each contact the contact resistance and the failing power can be calculated. If, optionally or in combination, either the amount of deviation from the symmetry of the current distribution, the resistance of a string or the power of a string exceeds a warning threshold, this can be detected and lead to the triggering of a warning message and/or the initiation of countermeasures. When a respective error threshold is reached, the current flow can be interrupted, for example.

According to one embodiment of the battery test stand, it is provided that the first connector has exactly two contact pins and exactly two contact sockets and/or the second connector has exactly two contact pins and exactly two contact sockets.

It may be provided that the first connector has exactly three contact pins and exactly three contact sockets and/or the second connector has exactly three contact pins and exactly three contact sockets.

According to one embodiment of the battery test stand, the first connector has up to ten contact pins and up to ten contact sockets and/or the second connector has up to ten contact pins and up to ten contact sockets.

A third connection for connecting a third terminal of the battery to a third terminal of the source may be provided, wherein the third connection comprises a third connector, wherein the third connector comprises at least two contact pins, wherein, in the mated state, a respective contact pin is seated in each case in an associated contact socket of the third connector and each contact pin forms in each case an electrical contact with each contact socket.

According to one embodiment of the battery test stand, it is provided that each connector comprises a plug and a mating plug, wherein the plug carries the contact pins and the mating plug carries the contact sockets, or wherein the mating plug carries the contact pins and the plug carries the contact sockets.

According to a second aspect, the disclosure relates to a connector for a battery test stand according to the disclosure, wherein the connector is adapted to connect a terminal of the battery to a terminal of the source, wherein the connector has at least two contact pins, wherein, in the mated state, a respective contact pin is seated in each case in an associated contact socket of the connector and each contact pin forms in each case a respective electrical contact with each contact socket.

According to a third aspect, the disclosure relates to a method comprising the steps of: Operating a battery test stand, wherein a source for providing electrical charging power is connected to a battery to be tested, wherein a first connection is formed between a first terminal of the battery and a first terminal of the source, wherein a second connection is formed between a second terminal of the battery and a second terminal of the source, wherein the first connection comprises a first connector, wherein the first connector comprises at least two contact pins, wherein, in the mated state, a respective contact pin is seated in each case in an associated contact socket of the first connector and each contact pin forms in each case an electrical contact with each contact socket wherein the second connection comprises a second connector, wherein the second connector comprises at least two contact pins, wherein, in the mated state, a respective contact pin is seated in each case in an associated contact socket of the second connector and each contact pin forms in each case an electrical contact with each contact socket; monitoring of all electrical contacts by means of a monitoring device.

BRIEF DESCRIPTION OF THE DRAWINGS

The disclosure is described in more detail below with reference to drawings illustrating exemplary embodiments. They show schematically in each case.

DETAILED DESCRIPTION OF THE DRAWINGS

Figure 1:
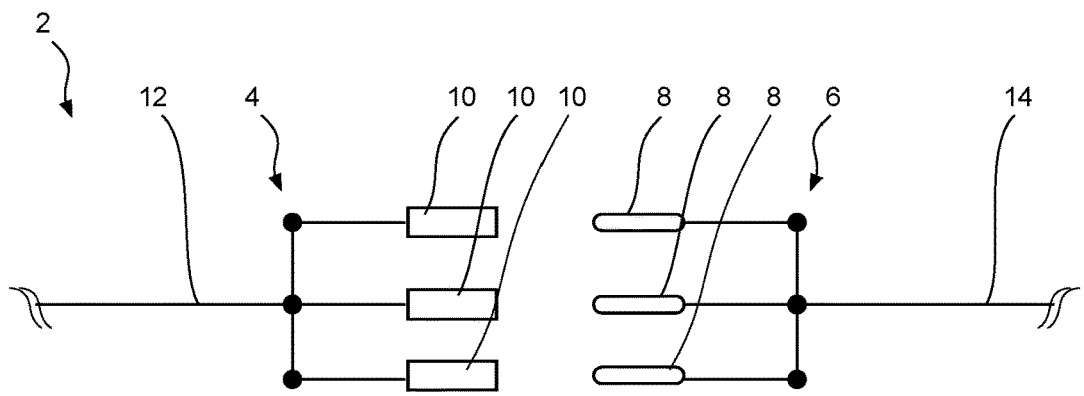
FIG. 1 shows a connector for a battery test stand according to the disclosure.

FIG. 1 shows a connector 2 for a battery test stand. The connector 2 has a plug 4 and a mating plug 6. The connector 2 is designed to connect a terminal of a battery to be tested to a terminal of a source. When a source is referred to here, it is a source for providing electrical power, such as a current source, a voltage source or the like.

In the present case, the connector 2 has three contact pins 8, wherein the contact pins 8 are attached to the mating plug 6. The connector 2 has three contact sockets 10, wherein the contact sockets 10 are attached to the plug 4.

Each contact pin 8 forms an electrical contact with an associated contact socket 10 in the mated state, with a contact pin 8 sitting in each contact socket 10 in the mated state. In the mated state, the connector 2 therefore has three electrical contacts to connect two lines 12, 14 to be connected in an electrically conductive manner.

Figure 2:
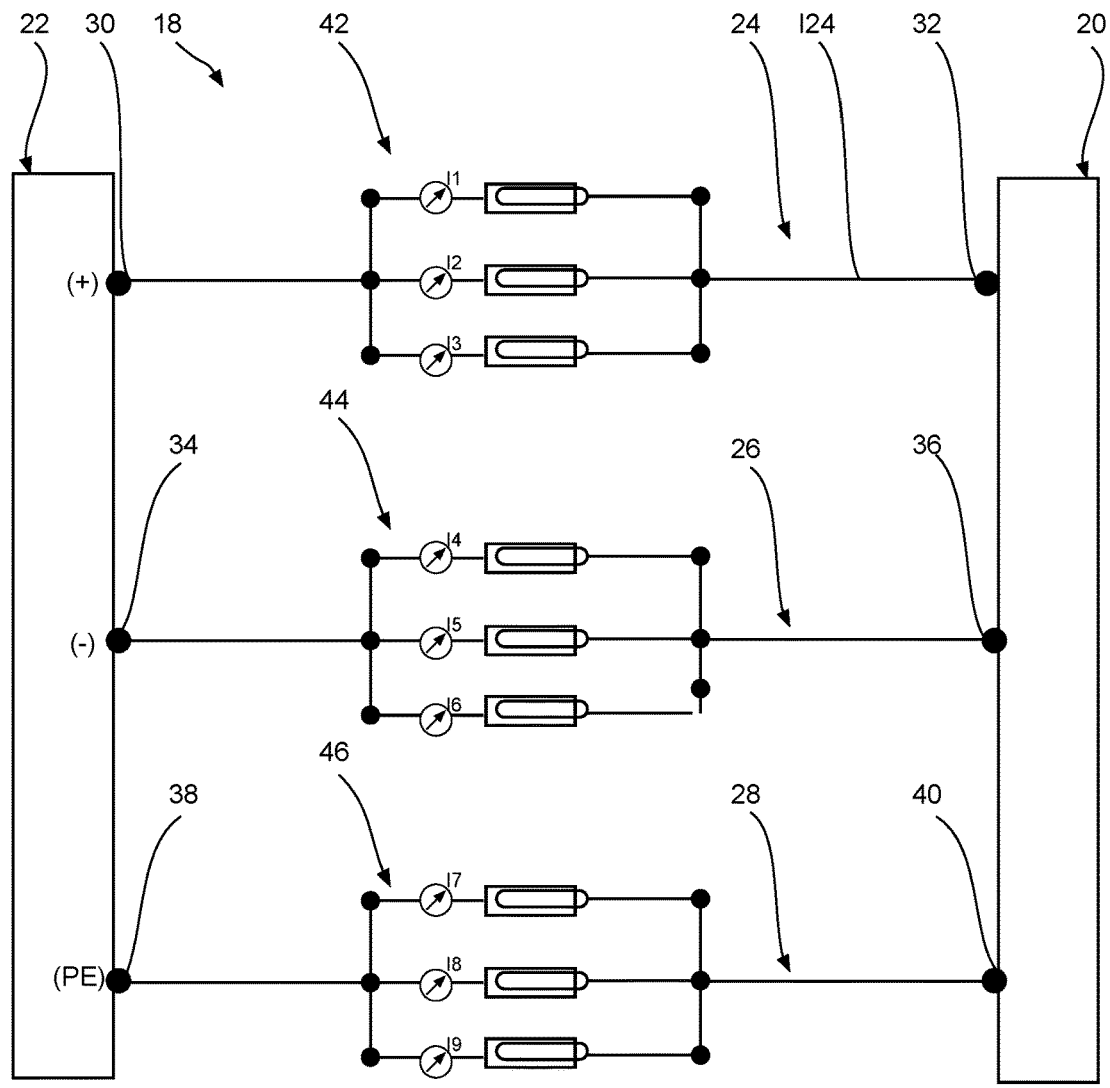
FIG. 2 shows a battery test stand according to the disclosure.

FIG. 2 shows a battery test stand 18. The battery test stand 18 has a source 20 for providing electrical charging power to a battery 22 to be tested. The source 20 may further serve as a sink for discharging the battery 22 to be tested.

A first connection 24, a second connection 26, and a third connection 28 are formed between the battery 22 and the source 20.

The first connection 24 connects a first terminal 30 of the battery 22 to a first terminal 32 of the source. The second connection 26 connects a second terminal 34 of the batter to a second terminal 36 of the source. The third connection 28 connects a third terminal 38 of the battery 22 to a third terminal 40 of the source. The terminals of the battery 22 may be, for example, a positive terminal (+), a negative terminal (−) and a protective earth terminal (PE).

The first connection has a first connector 42. The second connection 26 has a second connector 44. The third connection 28 has a third connector 46. The connectors 42, 44, 46 are of identical construction to the connector 2 described above with reference to FIG. 1. Accordingly, each of the connectors 42, 44, 46 has three contact pins which are each seated in associated contact sockets, so that each of the connectors 42, 44, 46 forms three separate electrical contacts, i.e. a first contact, a second contact and a third contact.

A monitoring device monitors each of the electrical contacts. Thus, during the transfer of a charging power from the source 20 to the battery 22 and also during the discharging of the battery 22, a current flowing in the area of each contact is measured. The monitoring device is represented in the present case by the current measurements I1, I2, I3, I4, I5, I6, I7, I8, I9.

To monitor the individual contacts of a respective connector 42, 44, 46, it is checked whether the individual partial currents of the paths formed by the individual contact sockets and contact pins are approximately equal in magnitude. For the example of connector 42, the partial currents I1, I2 and I3 should be approximately equal in magnitude insofar as each of the contacts is fault-free. This applies analogously to the partial currents I4, I5, I6 of the connector 44 and to the partial currents I7, I8, I9 of the connector 46.

Thus, an average partial current $I_m=(I1+I2+I3)/3$ is obtained for the connector 42, since a total current I24 of the first connection 24 should be equally divided among all three paths of the connector 42, as far as each of the contacts is fault-free.

If a check of the partial currents reveals that, for example, a deviation $\Delta I=I1-I_m$ of the first partial current of the connector 42 exceeds a specified limit value, the respective contact is faulty. This can be checked analogously for each of the values I2, I3, I4, I5, I6, I7, I8, I9.

Figure 3:
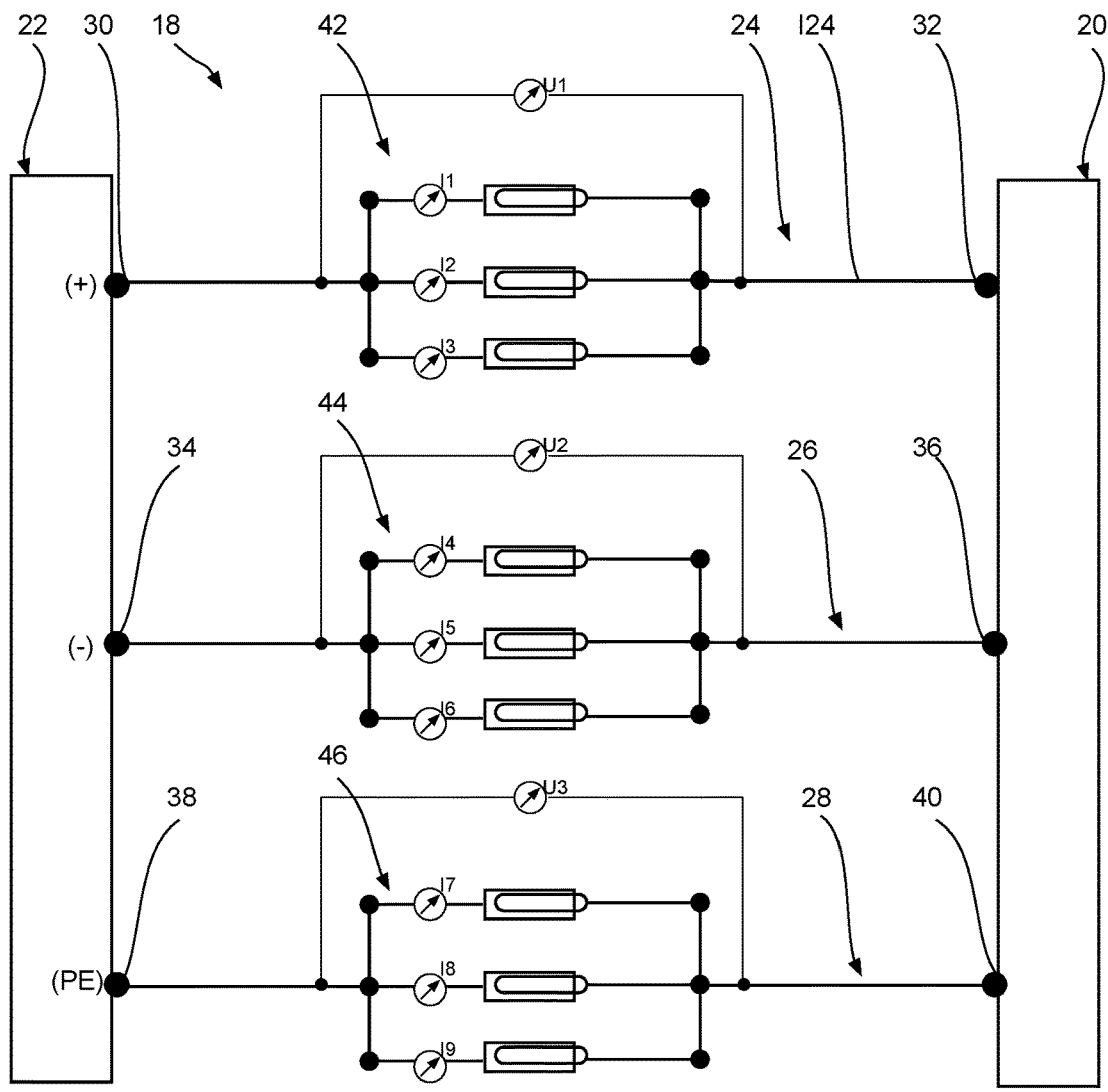
FIG. 3 shows the battery test stand according to the disclosure from FIG. 2.
Figure 5:
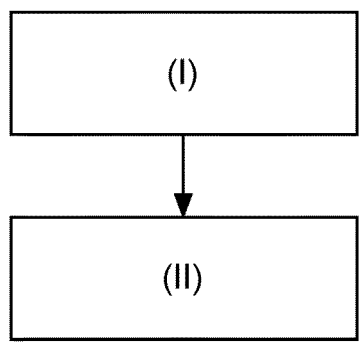
FIG. 5 shows method steps.
Figure 4:
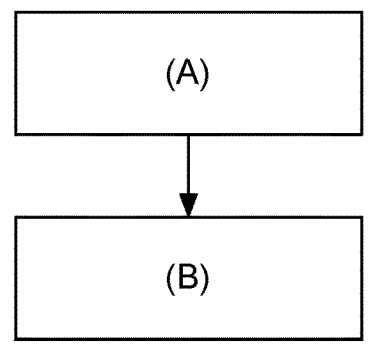
FIG. 4 shows method steps.

FIG. 3 shows an alternative embodiment of a monitoring device for which, in addition to the partial currents I1, I2, I3, I4, I5, I6, I7, I8, I9 mentioned, a measurement of the respective voltage U1, U2, U3 across the respective connector 42, 44, 46 is performed.

From the voltage U1, the partial current I1 can be used to calculate the power P1=U1*I1 or the resistance R1 of the first contact of the connector 42 to R1=U1/I1. This calculation can be performed analogously for each of the three paths of a respective connector 42, 44, 46. Here, too, it can be checked whether a corresponding power and/or a corresponding resistance deviates too much from a predetermined setpoint value or whether a predetermined deviation exceeds a threshold value of the deviation.

Due to the fact that for each of the connections 24, 26, 28 not only one connector with one contact pin and one contact socket each, i.e. one connector with only one contact, is used, but the respective connectors 42, 44, 46 each have three contact pins and three associated contact sockets, i.e. each have three contacts, these three contacts of a respective connector 42, 44, 46 can be used due to their symmetry to mutually monitor each other and to check for function.

Therefore, a method can be specified, having the method steps of:
(A) Operating a battery test stand 18, wherein a source 20 for providing an electrical charging power is connected to a battery 22 to be tested, wherein a first connection 24 is formed between a first terminal 30 of the battery 22 and a first terminal 32 of the source 20, wherein a second connection 26 is formed between a second terminal 34 of the battery 22 and a second terminal 36 of the source 20, wherein a third connection 28 is formed between a third terminal 38 of the battery 22 and a third terminal 40 of the source wherein the first connection 24 comprises a first connector 42, wherein the first connector 42 comprises three contact pins, wherein, in the mated state, a respective contact pin is seated in each case in an associated contact socket of the first connector 42 and each contact pin forms in each case an electrical contact with each contact socket, wherein the second connection 26 comprises a second connector 44, wherein the second connector 44 comprises three contact pins, wherein, in the mated state, a respective contact pin is seated in each case in an associated contact socket of the second connector 44 and each contact pin forms in each case an electrical contact with each contact socket, and wherein the third connection 28 comprises a third connector 46, wherein the third connector 46 comprises three contact pins, wherein, in the mated state, a respective contact pin is seated in each case in an associated contact socket of the second connector 44, and each contact pin forms in each case an electrical contact with each contact socket;
(B) Monitoring of all electrical contacts by means of a monitoring device.

Figure 6:
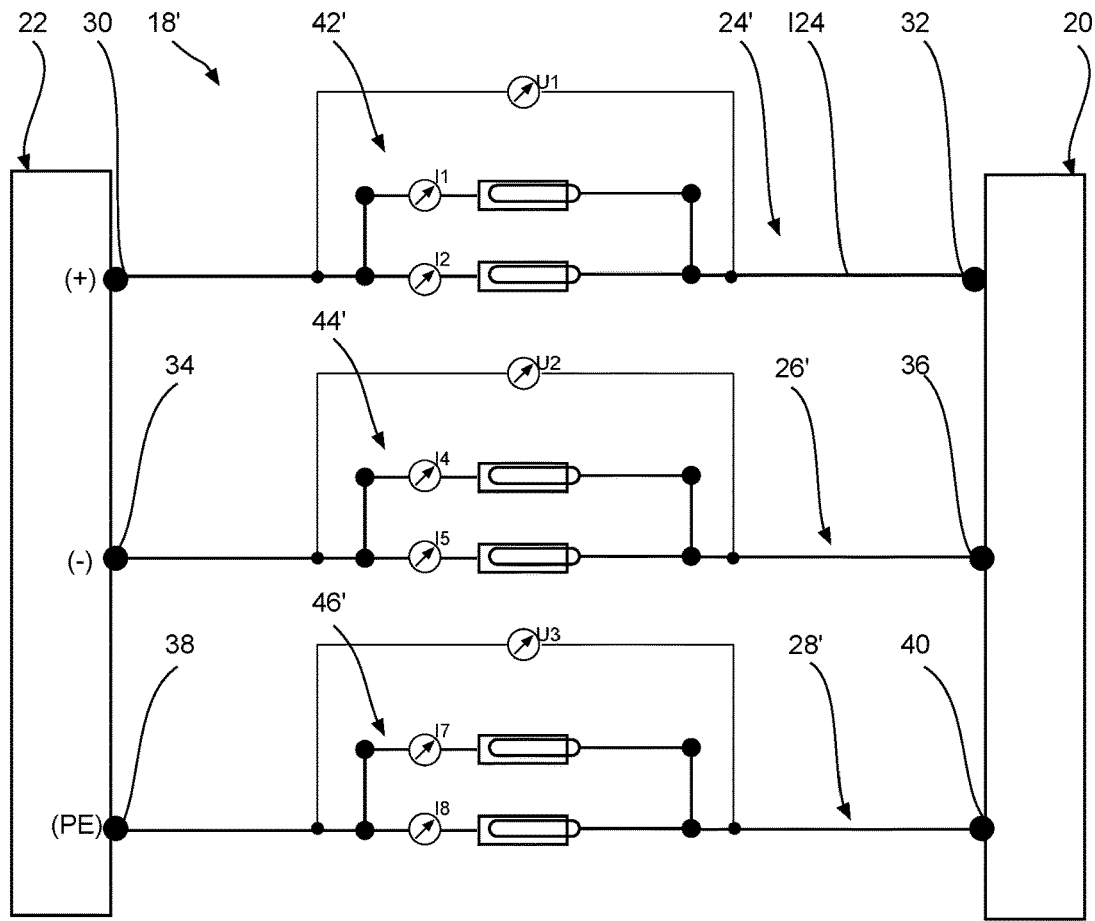
FIG. 6 shows another battery test stand according to the disclosure.
Figure 7:
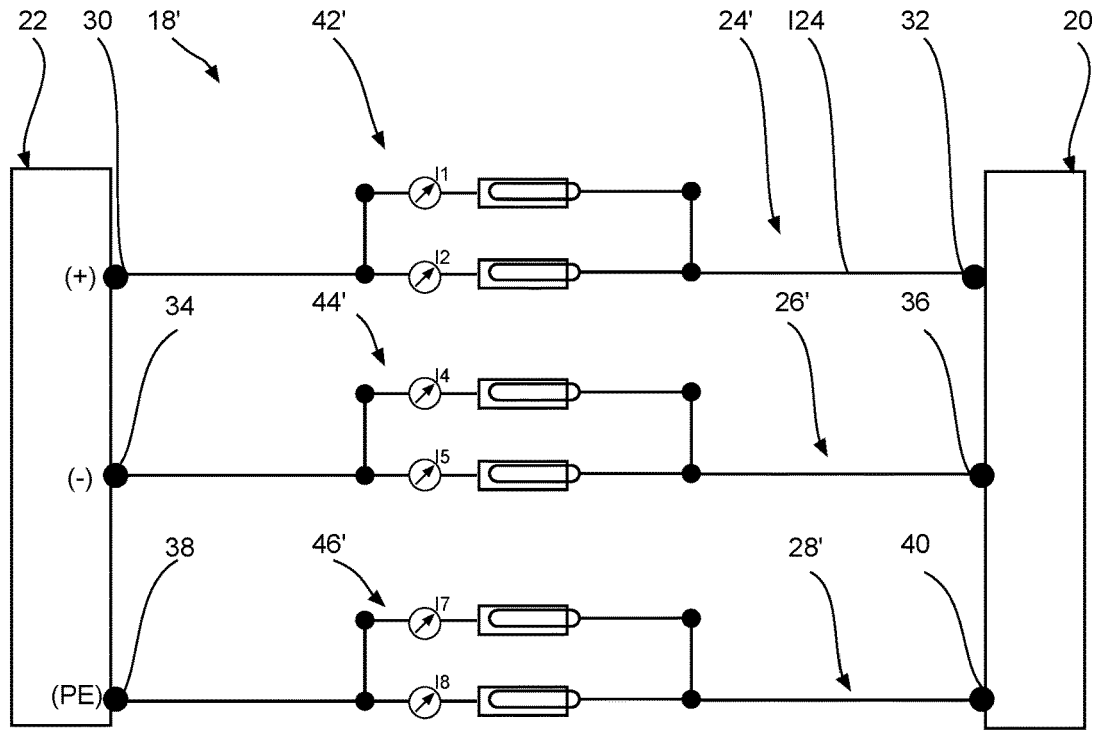
FIG. 7 shows another battery test stand according to the disclosure.

The procedure described above can be equally applied to a battery test stand 18' according to FIG. 6 and FIG. 7. In order to avoid repetition, only the differences from the above-described exemplary embodiment are discussed, wherein the same reference signs are assigned to the same features.

The battery test stand 18' differs from the battery test stand 18 in that connections 24', 26', 28' are provided with only two paths, i.e. two contacts. Each plug connection 42', 44', 46' therefore has exactly two contact sockets and exactly two contact pins.

Therefore, a method can be specified, having the method steps of:
(I) Operating a battery test stand 18', wherein a source 20 for providing electrical charging power is connected to a battery 22 to be tested, wherein a first connection 24' is formed between a first terminal 30 of the battery 22 and a first terminal 32 of the source 20, wherein a second connection 26' is formed between a second terminal 34 of the battery 22 and a second terminal 36 of the source 20, wherein a third connection 28' is formed between a third terminal 38 of the battery 22 and a third terminal 40 of the source 20, wherein the first connection 24' comprises a first connector 42', wherein the first connector 42' comprises two contact pins, wherein, in the mated state, a respective contact pin is seated in each case in an associated contact socket of the first connector 42' and each contact pin forms in each case an electrical contact with each contact socket; wherein the second connection 26' comprises a second connector 44', wherein the second connector 44' comprises two contact pins, wherein, in the mated state, a respective contact pin is seated in each case in an associated contact socket of the second connector 44 and each contact pin forms in each case an electrical contact with each contact socket, and wherein the third connection 28' comprises a third connector 46', wherein the third connector 46' comprises two contact pins, wherein, in the mated state, a respective contact pin is seated in each case in an associated contact socket of the second connector 44 and each contact pin forms in each case an electrical contact with each contact socket;
(II) Monitoring of all electrical contacts by means of a monitoring device.

The invention claimed is:

1. A battery test stand comprising:
a source for providing electrical charging power to a battery to be tested,
a first connection for connecting a first terminal of the battery to a first terminal of the source,
a second connection for connecting a second terminal (34) of the battery to a second terminal of the source,
wherein the first connection comprises a first connector, wherein the first connector comprises at least two contact pins, wherein, in the mated state, a respective contact pin is seated in each case in an associated contact socket of the first connector and each contact pin forms in each case an electrical contact with each contact socket,
wherein the second connection comprises a second connector, wherein the second connector comprises at least two contact pins, wherein, in the mated state, a respective contact pin is seated in each case in an associated contact socket of the second connector and each contact pin forms in each case an electrical contact with each contact socket, and
a monitoring device for monitoring all electrical contacts.

2. The battery test stand according to claim 1, wherein the monitoring device is designed to compare the respective individual currents flowing across the individual electrical contacts, and
a device for current measurement is assigned to each electrical contact.

3. The battery test stand according to claim 1, wherein the monitoring device is designed to compare the respective contact resistances formed at the individual electrical contacts, and
a device for current measurement is assigned to each electrical contact and wherein a device for voltage measurement is assigned to each connector.

4. The battery test stand according to claim 1, wherein the first connector has exactly two contact pins and exactly two contact sockets, and/or
the second connector has exactly two contact pins and exactly two contact sockets.

5. The battery test stand according to claim 1, wherein the first connector has exactly three contact pins and exactly three contact sockets,
and/or
the second connector has exactly three contact pins and exactly three contact sockets.

6. The battery test stand according to claim 1, wherein the first connector has up to ten contact pins and up to ten contact sockets,
and/or
the second connector has up to ten contact pins and up to ten contact sockets.

7. The battery test stand according to claim 1, further comprising:
a third connection for connecting a third terminal of the battery to a third terminal of the source,
wherein the third connection comprises a third connector, wherein the third connector comprises at least two contact pins, wherein, in the mated state, a respective contact pin is seated in each case in an associated contact socket of the second connector and each contact pin forms in each case an electrical contact with each contact socket.

8. The battery test stand according to claim 1, wherein each connector has a plug and a mating plug,
wherein the plug carries the contact pins and the mating plug carries the contact sockets, or
wherein the plug carries the contact pins and the mating plug carries the contact sockets.

9. A connector for a battery test stand according to claim 1, wherein the connector is adapted to connect a terminal of the battery to a terminal of the source,
wherein the connector has at least two contact pins,
wherein, in the mated state, a respective contact pin is seated in each case in an associated contact socket of the connector and each contact pin forms in each case a respective electrical contact with each contact socket.

10. A method including the following steps:
operating a battery test stand,
wherein a source for providing electrical charging power is connected to a battery to be tested,
wherein a first connection is formed between a first terminal of the battery and a first terminal of the source,
wherein a second connection is formed between a second terminal of the battery and a second terminal of the source,
wherein the first connection comprises a first connector, wherein the first connector comprises at least two contact pins, wherein, in the mated state, a respective contact pin is seated in each case in an associated contact socket of the first connector and each contact pin forms in each case an electrical contact with each contact socket,
wherein the second connection comprises a second connector, wherein the second connector comprises at least two contact pins, wherein, in the mated state, a respective contact pin is seated in each case in an associated contact socket of the second connector and each contact pin forms in each case an electrical contact with each contact socket;
monitoring of all electrical contacts by a monitoring device.

* * * * *